(12) United States Patent
Khan et al.

(10) Patent No.: US 9,331,240 B2
(45) Date of Patent: May 3, 2016

(54) UTLRAVIOLET LIGHT EMITTING DEVICES AND METHODS OF FABRICATION

(75) Inventors: M. Asif Khan, Irmo, SC (US); Qhalid Fareed, Columbia, SC (US); Vinod Adivarahan, Columbia, SC (US)

(73) Assignee: University of South Carolina, Columbia, SC (US)

( * ) Notice: Subject to any disclaimer, the term of this patent is extended or adjusted under 35 U.S.C. 154(b) by 1503 days.

(21) Appl. No.: 12/480,304

(22) Filed: Jun. 8, 2009

(65) Prior Publication Data

US 2010/0032647 A1   Feb. 11, 2010

Related U.S. Application Data

(60) Provisional application No. 61/131,233, filed on Jun. 6, 2008, provisional application No. 61/131,211, filed on Jun. 6, 2008.

(51) Int. Cl.
| | |
|---|---|
| *H01L 33/12* | (2010.01) |
| *H01L 21/02* | (2006.01) |
| *H01L 33/00* | (2010.01) |
| *H01L 33/20* | (2010.01) |

(52) U.S. Cl.
CPC ............ *H01L 33/12* (2013.01); *H01L 21/0242* (2013.01); *H01L 21/0254* (2013.01); *H01L 21/0262* (2013.01); *H01L 21/02458* (2013.01); *H01L 21/02647* (2013.01); *H01L 33/007* (2013.01); *H01L 33/20* (2013.01)

(58) Field of Classification Search
CPC .................................................. H01L 21/0265
See application file for complete search history.

(56) References Cited

U.S. PATENT DOCUMENTS

| | | | | |
|---|---|---|---|---|
| 6,172,382 | B1 * | 1/2001 | Nagahama et al. | 257/94 |
| 7,498,182 | B1 * | 3/2009 | Sampath et al. | 438/21 |

* cited by examiner

*Primary Examiner* — Jerome Jackson, Jr.

(57) ABSTRACT

An ultraviolet light emitting semiconductor chip, its use in a LED, and methods of its fabrication are disclosed. The semiconductor chip can include a buffer layer of $Al_xGa_{1-x}N$, where $0<x\leq 1$ having a thickness from about 10 μm to about 3 mm and defining apertures in the thickness of the buffer layer formed due to lateral overgrowth of the buffer layer over a grooved basal substrate. A n-junction LED layer overlying the buffer layer, a multiple quantum well LED layer overlying the n-junction LED layer, and a p-junction LED layer overlying the multiple quantum well LED layer are also included in the chip, where all of the LED layers comprise $Al_xGa_{1-x}N$, where $0<x\leq 1$.

12 Claims, 14 Drawing Sheets

UTLRAVIOLET LIGHT EMITTING DEVICES AND METHODS OF FABRICATION

PRIORITY INFORMATION

The present application claims priority to U.S. Provisional Patent Application Ser. No. 61/131,233 titled "Ultraviolet Light Emitting Device and Method of Fabrication on Pulsed Lateral Overgrown III-Nitride Layers" filed on Jun. 6, 2008 and U.S. Provisional Patent Application Ser. No. 61/131,211 titled "Light Emitting Device and Method of Fabricating the Same Using Metalorganic Hydride Vapor Epitaxy (MOHVPE)" filed on Jun. 6, 2008, the disclosures of which are incorporated by reference herein.

GOVERNMENT SUPPORT CLAUSE

The present invention was developed with funding from DARPA under award—W911NF-06-0516 and N00014-07-1-0161. The government retains certain rights in this invention.

BACKGROUND

Research interest in the III-Nitride deep ultraviolet (UV) light emission devices has significantly increased over the past few years. Their potential as a replacement for mercury lamps in several bio-medical, air-water purification, and germicidal systems is one of the key drivers for this research. Due to the transparency requirements, the substrate choices for the sub-300 nm AlGaN deep UV surface emission devices, such as light emitting diodes (LEDs), are limited to either single crystal sapphire or AlN. Currently available bulk AlN substrates typically have a strong absorption band for wavelengths around 280 nm which limits their use for ultraviolet subtype C [UVC] LEDs. Sapphire, due to its high UV transparency, is an excellent substrate choice at the deep UV wavelengths. However, its thermal conductivity is only 0.35 $Wcm^{-1}C^{-1}$ as compared to AlN substrates which have a thermal conductivity of 2.85 $Wcm^{-1}C^{-1}$. The lower thermal conductivity results in a high thermal impedance and hence substantially lower DC saturated currents. Simulations show that the thermal impedance can be significantly reduced by incorporating AlN buffer layers with thicknesses in excess of 10 μm over the sapphire substrates. However, when such thick buffer layers are deposited over sapphire using the conventional metalorganic chemical vapor deposition (MOCVD), they crack due to the stress which arises from the thermal expansion coefficient and the lattice mismatch. Moreover, the typical growth rates for AlN MOCVD over sapphire at growth temperatures around 1200° C. are only 0.3-0.5 μm/h. This leads to excessively long times for growing the thick AlN buffers which are required for the low-thermal impedance.

Currently several research groups are actively developing low-defect density AlN substrates to improve the power-lifetime performance of the deep UV LEDs. In the one of the prior art, a new air bridge assisted high-temperature (1500° C.) lateral epitaxy approach to deposit 12 μm thick high-quality AlN layers over SiC substrates as templates for the DUV LEDs. More recently, it has also reported the growth of low dislocation thick AlN layers over grooved SiC substrates for deep UV device epitaxy. Instead of pulsing the metalorganics, a very high growth temperature (1500° C.) with air-bridge assisted CVD growth was used. The 1500° C. growth temperature enabled them to achieve a lateral grow.

Significant progress has also been made in the development of III-Nitride deep ultraviolet (UV) light emitting diodes (LEDs) grown on sapphire substrates using AlGaN multiple quantum well (MQW) active regions. Milliwatt power DUV LEDs for the UVA, UVB and the UVC regions on sapphire substrates with AlGaN multiple quantum well (MQW) active regions have been reported. This progress was largely based on the advancements integrated in the first reported deep UV LEDs demonstrating sub-milliwatt output power. The key to the demonstration of these devices was based on three technical advancements. First, was the use of pulsed atomic layer epitaxy (PALE) to improve the quality of the buffer AlN layer. PALE deposited $Al_xGa_{1-x}N/Al_yGa_{1-y}N$ short-period superlattices were also inserted between the buffer AlN and the n-contact AlGaN layer to control the thin-film stress, thereby mitigating epilayer cracking. Finally, a p-GaN/p-AlGaN heterojunction contact layer was used to improve hole injection.

In these first generation UVLEDs, under a cw-pump current of 20 mA, the average output powers for state-of-the-art 300 $\mu m^2$ UVC LEDs are about 1 mW. Due to the poor thermal conductivity of the sapphire substrates, these powers quickly saturate at pump currents around 40-50 mA.

Although the first generation deep UV light emitting devices represent a potential solid state replacement source for more traditional mercury based lamps, these devices suffer from premature performance degradation. Under cw-bias conditions, at 20 mA pump current, the on-wafer device lifetimes (50% power reduction) are only about 50-100 h. 100 h. Their output powers exhibited a fast reduction (~10% reduction in output power after several hours) followed by a slower decrease (~50% reduction in output power after 10-100 hours) during on wafer testing. Flip-chip packaging of these devices with heat sinks increased the lifetime to approximately 1000 hours for a pump current density of 200 $A/cm^2$. These studies have shown the initial fast decrease to be both current and temperature dependent and this decrease is related to a device burn-in that creates small, localized alternative current paths, reducing the diode efficiency. At this time it is unclear whether this phenomenon is related to surface states on the mesa sidewalls, or localized regions within the diode active area. It has also been demonstrated that the slow degradation is strongly dependent on the junction temperature which increases with applied bias (joule heating) resulting in the increase and activation of the non-radiative recombination centers. This degradation is a very strong function of the cw-pump current density The key reasons for this power/lifetime limitation are the dislocations in the active region and the excessive heating due to the poor thermal conductivity of sapphire. Many commercial applications, however, require the output powers and lifetimes to be significantly better than the best values reported to date. Therefore, the lifetime of deep UV LEDs increases significantly if the number of defects in the active area is reduced, and the thermal conductivity of the substrate material is increased to reduce the overall thermal impedance. An increase in device lifetime by approximately 10× was previously observed for 365 nm UV LEDs associated with reducing the defect density from $10^8$ $cm^{-2}$ to $10^7$ $cm^{-2}$ and lifetime was also shown to be inversely proportional to junction temperature.

As such, a need exists for high power, stable and highly efficient ultraviolet (UV) light emission devices and method for fabricating the same.

SUMMARY

Objects and advantages of the invention will be set forth in part in the following description, or may be obvious from the description, or may be learned through practice of the invention.

In general, the present invention is directed to an ultraviolet light emitting semiconductor chip and its use in a LED. The semiconductor chip includes a buffer layer comprising $Al_xGa_{1-x}N$, where $0<x\leq1$ having a thickness from about 10 µm to about 3 mm (e.g., from about 10 µm to about 40 µm and from about 20 µm to about 25 µm). The buffer layer defines apertures in the thickness of the buffer layer formed due to lateral overgrowth of the buffer layer over a grooved basal substrate. The apertures defined in the thickness of the buffer layer can be substantially triangular in shape. Additionally, a n-junction LED layer overlying the buffer layer, a multiple quantum well LED layer overlying the n-junction LED layer, and a p-junction LED layer overlying the multiple quantum well LED layer are included in the chip, where all of the LED layers comprise $Al_xGa_{1-x}N$, where $0<x\leq1$.

In one embodiment, the semiconductor chip further comprises the basal substrate such that the buffer layer overlies an internal surface of the basal substrate. Grooves can be defined either in the base layer or an epilayer overlying the base layer, where the epilayer comprises $AlGa_{1-x}N$, where $0<x\leq1$ and is from about 0.1 µm to about 4 µm thick. The base layer can be removed during formation of the semiconductor chip leaving the buffer layer to act as a base for the semiconductor chip, although it can remain on the final chip if constructed from an ultraviolet transparent material (e.g., sapphire, aluminum nitride, aluminum gallium nitride, or aluminum indium gallium nitride).

A pair of electrodes can overlie the p-junction LED layer to form a light emitting device. The multiple quantum well of the device can emit light having a wavelength between about 190 nm and about 369 nm. Additionally, the lifetime of the light emitting device can be from about 1 hour to about $10^6$ hours.

The present invention is also directed to a method of making a semiconductor chip for use in a light emitting device. The method includes forming a buffer layer to a thickness of from about 10 µm to about 30 mm over a surface of a basal substrate defining a plurality of grooves. The buffer layer comprises $Al_xGa_{1-x}N$, where $0<x\leq1$, and defines apertures extending from the grooves of the basal substrate into the thickness of the buffer layer. A growth mode transition is performed during the formation of the buffer layer from a non-pulse growth mode to a pulse growth mode.

Additionally, a n-junction LED layer is formed over the buffer layer; a multiple quantum well LED layer is formed over the n-junction LED layer; and a p-junction LED layer is formed over the multiple quantum well LED layer. Each of the LED layers can comprise $Al_xGa_{1-x}N$, where $0<x\leq1$.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which:

FIG. 11 (b) shows the scanning electron microscope image of the pulsed lateral overgrown AlN layer of Example 2.

Figure 1:
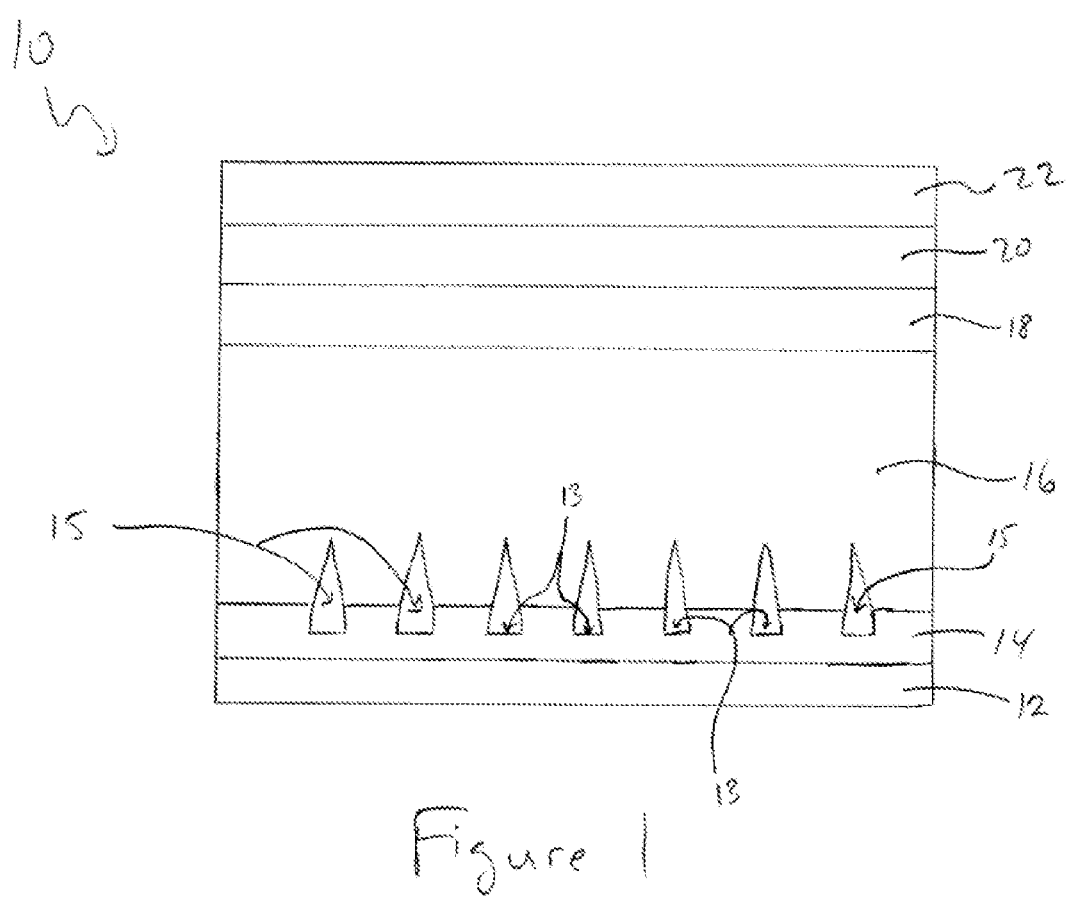
FIG. 1 shows a schematic diagram of an exemplary semiconductor chip for use in an ultraviolet light emitting diode over a low dislocation density $Al_xGa_{1-x}N$, where $0<x\leq1$, template.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present invention relates to the development of highly stable deep ultra-violet light emitting diodes (LEDs) and improving the power-lifetime performance of UV light emitting diodes (LEDs) for commercial applications.

The LEDs of the present invention can be formed by growing a group-III nitride template on a UV-light transparent substrate (e.g., a sapphire, aluminum gallium nitride substrate) and then flip-chip mounting the LED electrodes such that the UV light is emitted through the UV-light transparent substrate. "Group III nitride" refers to those semiconducting compounds formed between elements in Group III of the periodic table and nitrogen. More preferably the Group III element is selected from the group consisting of aluminum (Al), gallium (Ga), and indium (In). As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN). However, the inclusion of indium in layers of the LED can cause a shift in wavelength of the emitted light to the visible and out of the ultraviolet. Thus, in one embodiment, the nitride layers of the LED of the present invention can be substantially free of indium.

The group III nitride epilayer can be applied on a substrate using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Pulse atomic layer epitaxy (PALE) allows accurate control of the quaternary layer composition and thickness by simply changing the number of aluminum, indium, and gallium pulses in a unit cell and the number of unit cell repeats. By controlling the pulse time, pulse condition, flow rate, and therefore chemical availability, the systematic growth provides a layer with significant control of the composition, thickness and crystalline quality. (J. Zhang et al., Applied Physics Letters, Vol. 79, No. 7, pp. 925-927, 13 Aug. 2001, J. P. Zhang et al. Applied Physics Letters, Vol. 81, No. 23, pp. 4392-4394, 2 Dec. 2002).

Pulsed lateral overgrowth (PLOG) is a technique wherein a Group III comprising material (e.g., triethyl gallium or trialkly aluminum) and a nitrogen material (e.g., ammonia) are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5, which is incorporate by reference herein. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

FIG. 1 shows a cut-away side view of the semiconductor chip 10 for forming an LED according to the present invention. The semiconductor chip 10 has an optional epilayer 14 overlying a substrate 12, which together form the basal substrate to grow the remaining layers. A buffer layer 16 overlies the epilayer 14. Alternatively, the buffer layer 16 can directly overly the substrate 12, when no epilayer exists on the substrate. The buffer layer 16 defines apertures 15 that extend from a groove 13 in the internal surface of the epilayer 14 (or the substrate 12 when no epilayer is present) into the thickness of the buffer layer 16. As shown, the apertures 15 can be substantially triangular in shape due to the lateral overgrowth technique used to form the buffer layer 16 discussed in greater detail below.

$Al_xGa_{1-x}N$ multiple quantum well (MQW) based p-n junction LED layers 18, 20, and 22 overlie the buffer layer 16. Specifically, the n-junction LED layer 18 overlies the buffer layer 16; the MQW LED layer 20 overlies the n-junction LED layer 18; and the p-junction LED layer 22 overlies the MQW LED layer 20.

One particular advantage of the present invention is the ability to form the LED 10 using the MOHVPE technique for depositing high-quality laterally grown thick-buffer and device quality heterostructures in a single run and within the same reactor. Thus, the heating and cooling cycles can be minimized (or limited to a single cycle) to avoid cracks and other defects that can occur through multiple heating and cooling cycles.

I. Substrate 12

In one embodiment, the substrate 12 comprises an UV-light transparent material (e.g., sapphire, aluminum gallium nitride) to enable the light emitting device to be "flip-chip" mounted such that light is emitted through the substrate 12. This substrate 12 forms a base layer to grow the other layers of the device.

Alternatively, the substrate 12 can be removed from the semiconductor chip in the final product, such that the epilayer 14 and/or the buffer layer 16 acts as the base for the chip. The substrate 12 can be removed from the chip according to any method (e.g., mechanical polishing, laser lift off through the use of a low temperature buffer layer between the substrate 12 and the buffer layer 16 that can be melted by a laser, chemical etching, etc.).

II. Epilayer 14

To form the LED 10, a nitride epilayer 14 can be first grown on the substrate 12. In employing growth techniques to grow the group III nitride epilayer 14, the precursor sources typically include a metal-organic source (e.g., trimethyl aluminum, trimethyl gallium, triethyl gallium), a nitrogen source (e.g., ammonia), a carrier gas (e.g., hydrogen and/or nitrogen), and an optional doping source (e.g., silane, biscyclopentadienyl magnesium, etc.). Of course, other materials can be utilized to grow the group III nitride epilayer, and the present invention is not intended to be limited by the above listed materials. For example, another type of a metal-organic source and/or a nitrogen source can be utilized to grow the group III nitride epilayer.

In one particular embodiment, the nitride epilayer 14 is formed using conventional MOCVD and/or pulsed low-pressure MOCVD to form a nitride layer having the composition $Al_xGa_{1-x}N$, where $0<x\leq 1$. The thickness of the nitride layer 14 can be up to about 0.5 μm (e.g., from about 0.1 μm to about 0.4 μm).

No matter the particular method used to form the epilayer 14, the epilayer 14 is etched after formation to form grooves 13 in the epilayer 14. In one particular embodiment, the epilayer 14 is etched using standard photolithography. It is also noted, that in one particular embodiment, an epilayer 14 can be omitted from the LED 10 such that the substrate 12 can be etched directly for growth of the buffer layer 16.

In one embodiment, the grooves 13 can have widths from about 2 μm to 20 μm (e.g., from about 4 μm to about 10 μm) and can be spaced from about 5 μm to about 20 μm apart (e.g., 6 μm to about 12 μm).

III. Buffer Layer

The buffer layer 16 is a relatively thick $Al_xGa_{1-x}N$, where $0\leq x\leq 1$, (e.g., up to about 3 mm, such as from about 10 μm to about 3 mm, and from about 10 μm to about 40 μm) layer formed over the basal substrate (i.e., directly on the substrate 12 or on the epilayer 14 when present). Due to the presence of the grooves in the basal substrate on which the buffer layer 16 is formed, apertures 15 extend into the thickness of the buffer layer 16. These apertures are a result of the later overgrowth technique utilized to form the buffer layer 16. The frequency, spacing, and size of the grooves in the basal substrate can factor into the thickness of the buffer layer 16 since the buffer layer 16 needs to be thick enough to allow the lateral growth technique to merge the buffer layer 16 to form a complete surface (i.e., unapertured) for growth of the LED layers. Thus, if the grooves are relatively wide in size, then the buffer layer 16 will generally be thicker do to the greater thickness required to merge the lateral growth of the layer into a complete surface.

In the present invention, two methods can be used to develop the buffer layer (and the other layers) to form high-quality and low thermal impedance templates for the epitaxy of deep UV devices: air-bridge assisted high-temperature pulsed lateral overgrowth (PLOG) and metalorganic hydride vapor phase epitaxy (MOHVPE) of AlGaN.

In air-bridge assisted pulsed lateral overgrowth (PLOG) approach, a 15-20 μm thick AlGaN buffer layer 16 can be deposited over basal plane sapphire substrates with dislocation densities less than $10^7$ cm$^{-2}$ in the lateral overgrown regions. However, the maximum lateral growth rate at 1150° C. is only about 0.5 μm/h. Thus, the growth times for completely coalesced films were well over 30 h. The low dislocation density pulsed laterally overgrown (PLOG) AlN layers has enabled the demonstration of optically pumped lasing at 214 nm.

The second approach of depositing low dislocation density AlGaN templates is by MOHVPE method. The MOHVPE technique is a combination of MOCVD and hydride vapor phase epitaxy. In the hydride vapor phase epitaxy (HVPE), AlGaN over sapphire can also be used to overcome the slow growth rate issue. However, for AlGaN buffers which are over 10 μm thick, the use of HVPE can lead to a poor surface quality. The HVPE technique also lacks the thickness control needed for depositing $Al_xGa_{1-x}N$ heterostructures with thicknesses ranging from 10 to 100 A for subsequent device fabrication. One can in principle transfer the HVPE grown AlN buffer layer over sapphire to an MOCVD reactor for subsequent device epilayer growth. However this will require etching and other surface preparation methods prior to the growth to remove the oxide layers and other impurities present. It is therefore extremely advantageous and important to develop techniques for preparing thick AlN buffer templates in-situ and utilize them for the device epi-structure growth. The problem of impurity incorporation in the template can be completely overcome as the substrate is not exposed to the atmosphere. It will also avoid dislocation regeneration at the growth interface during transition from one reactor to another.

Thus, through use of a metalorganic hydride vapor phase epitaxy (MOHVPE) system, which combines MOCVD and HVPE in a single growth chamber, a relatively thick (e.g., 15 μm to 3 mm) $Al_xGa_{1-x}N$ buffer layer 16 can be deposited over the grooved epilayer 14 or substrate 12 with lateral growth rates in excess of 2 μm/h. This growth approach, where MOCVD and HVPE growths can be carried out in the same reactor either sequentially or simultaneously in any arbitrary order, referred to as metalorganic hydride vapor phase epitaxy (MOHVPE), is discussed in detail in International Patent Application Serial No. PCT/US2007/086096 titled "Method and Apparatus for Growth of III-Nitride Semiconductor Epitaxial Layers", the disclosure of which is incorporated by reference herein. The combination of MOCVD and HVPE in the same reactor affords the flexibility to grow buffer and device layers at growth rates ranging from 0.1-10 μm/h without removing the substrate. It is therefore ideal for the deposition of thick $Al_xGa_{1-x}N$, where 0≤x≤1, buffers and deep UV light emission devices over substrates such as sapphire with excellent optical properties but a low thermal conductivity. In addition, the viability of the MOHVPE process for fast lateral epitaxy of AlN and a subsequent growth of high-quality UVC LED epilayers is demonstrated for the first time.

This system also allows growth of an optional second epilayer over the grooved epilayer 14 in MOCVD mode, followed by lateral overgrowth of an thick nitride layer 16, such as by using lateral overgrowth while operating the MOHVPE system in the HVPE mode or pulsed lateral overgrowth (PLOG) in the same reaction chamber.

The lateral overgrowth resulting from this procedure results in triangular shaped apertures 15 (i.e., pockets) before a complete coalescence of the lateral growth fronts to form the uniform upper portion of the thick nitride layer 16. These apertures 15 enable the thick nitride layer 16 to be grown to such thicknesses as up to 3 mm without substantial cracking.

IV. LED Layers

LED layers are also formed from $Al_xGa_{1-x}N$, where 0≤x≤1, to form a multiple quantum well (MQW) based p-n junction LED structure. These LED layers can also be formed in the same reaction chamber as the buffer layer. As shown in FIG. 1, a n-junction LED layer 18 overlies the buffer layer 16; a MQW LED layer 20 overlies the n-junction LED layer 18; and a p-junction LED layer 22 overlies the MQW LED layer 20.

Each of these layers can be fabricated to the desired thickness and can have an $Al_xGa_{1-x}N$, where 0≤x≤1, compositions selected for the desired wavelength emission (e.g., about 285 nm).

The dopants for the LED layers can also be selected for the desired emission. In one particular embodiment, for example, silicon, indium and/or oxygen can be used for the n-type dopants, and magnesium and/or zinc can be used as p-type dopants. Some intentional dopant, such as carbon, can also be incorporated. The dopant concentration can range from $1E^{15}$/cm$^2$ to $1E^{20}$/cm$^2$.

V. LED Electrodes

Mesa type LEDs with several different electrode geometries and active areas can be fabricated using reactive ion etching (RIE) to access the bottom n+-type AlGaN layer of the UV-LED structure. These devices can be circular devices with diameters ranging from 20-50 μm and/or rectangular devices with electrode dimensions from 50 μm to 150 μm for each side.

Metal contacts can be applied to the LED for the n- and p-contacts. For example, Ti/Al/Ti/Au and/or Ni/Au can be used, as metal contacts for the n- and p-contacts, respectively.

Finally, thick probe pads can be deposited on both contacts.

EXAMPLES

Example 1

Formation of a Grooved Basal Substrate

A high quality 0.1 μm thick AlN epilayer was grown on basal plane sapphire using pulsed low-pressure MOCVD followed by a 2-μm-thick $Al_xGa_{1-x}N$ layer with conventional MOCVD. For these growths the MOHVPE system was operated in the MOCVD mode. Trimethyl-aluminum, trimethyl-gallium and ammonia were used as the precursors and the growth temperature and pressure were 1050° C. and 76 torr respectively. The AlGaN layer was then grooved using standard photolithography and inductively coupled plasma assisted reactive ion etching (ICPRIE). The grooves were oriented along the AlN [1$\bar{1}$00] directions and their widths ranged from 4 to 10 µm with a period of 6 to 12 µm.

Formation of a Buffer Layer

The grooved template was then reloaded in the MOHVPE system. A 0.1-µm-thick AlN layer was then re-grown operating the MOHVPE reactor in the MOCVD mode. This was followed by lateral overgrowth of an AlN buffer layer with thicknesses up to 20 µm while operating the MOHVPE system in the HVPE mode. For the HVPE step, the growth temperature and pressure were 1200° C. and 150 Torr and we used $AlCl_3$ and ammonia as the precursors and hydrogen as the carrier gas for all the precursors. The growth rate for AlN was about 5 µm/h. In addition to yielding AlN layers with thicknesses in excess of 20 µm, the MOHVPE method also resulted in an extremely smooth surface morphology and dislocation densities as low as $10^7$ cm$^{-2}$ in the lateral overgrown regions.

Figure 2:
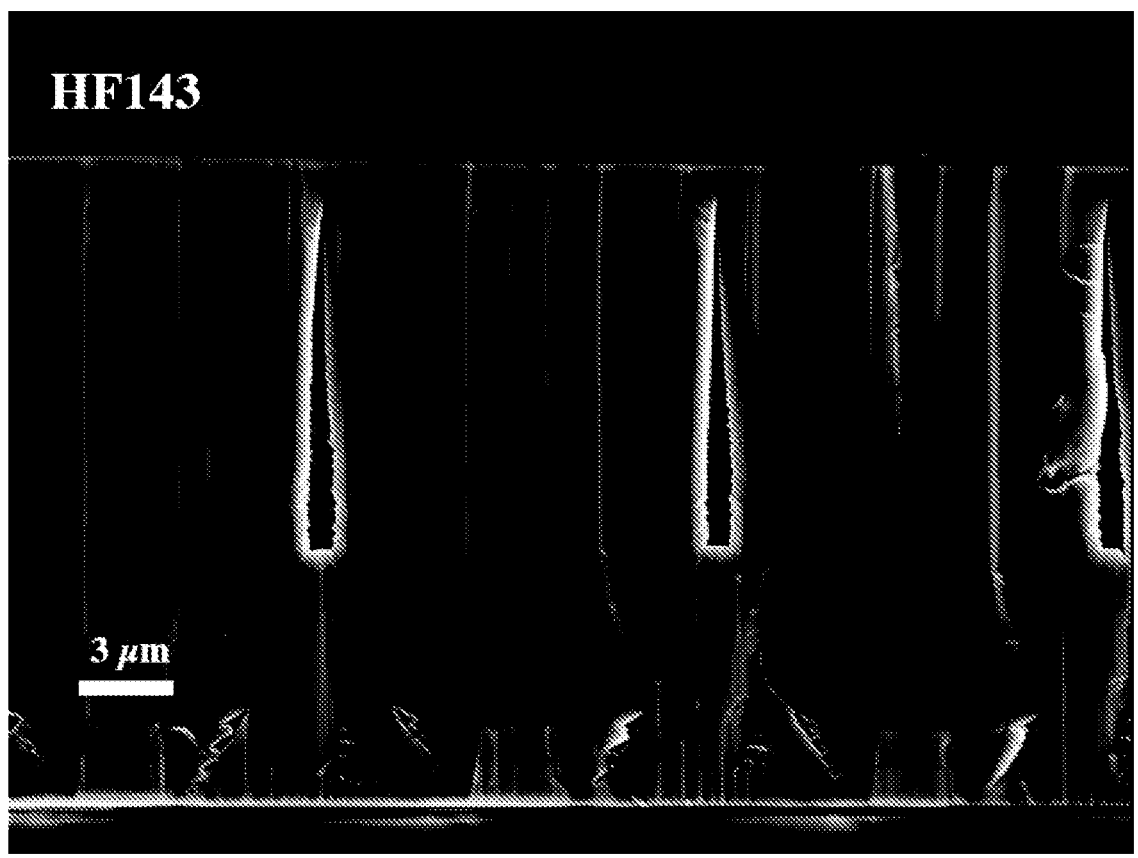
FIG. 2 shows a scanning electron microscopy of the MOHVPE formed AlN layer of Example 1.

In FIG. 2, a cross-section scanning electron micrograph (SEM) image of a 17-µm-thick MOHVPE AlN/sapphire template grown for 180 min is included. The width of trenches in this particular sample was 9-10 µm. Evidence of lateral growth from the 2 µm wide pillars (10 µm wide trenches) of the template is clearly visible. It gives rise to triangular shaped apertures before a complete coalescence of the lateral growth fronts. The vertical to lateral growth-rate ratio was approximately 1.7. The MOHVPE growth mode resulted in a complete coalescence over the entire 2 inch substrate. An additional 1 µm growth was carried out after the coalescence of the lateral growth fronts.

Figure 3:
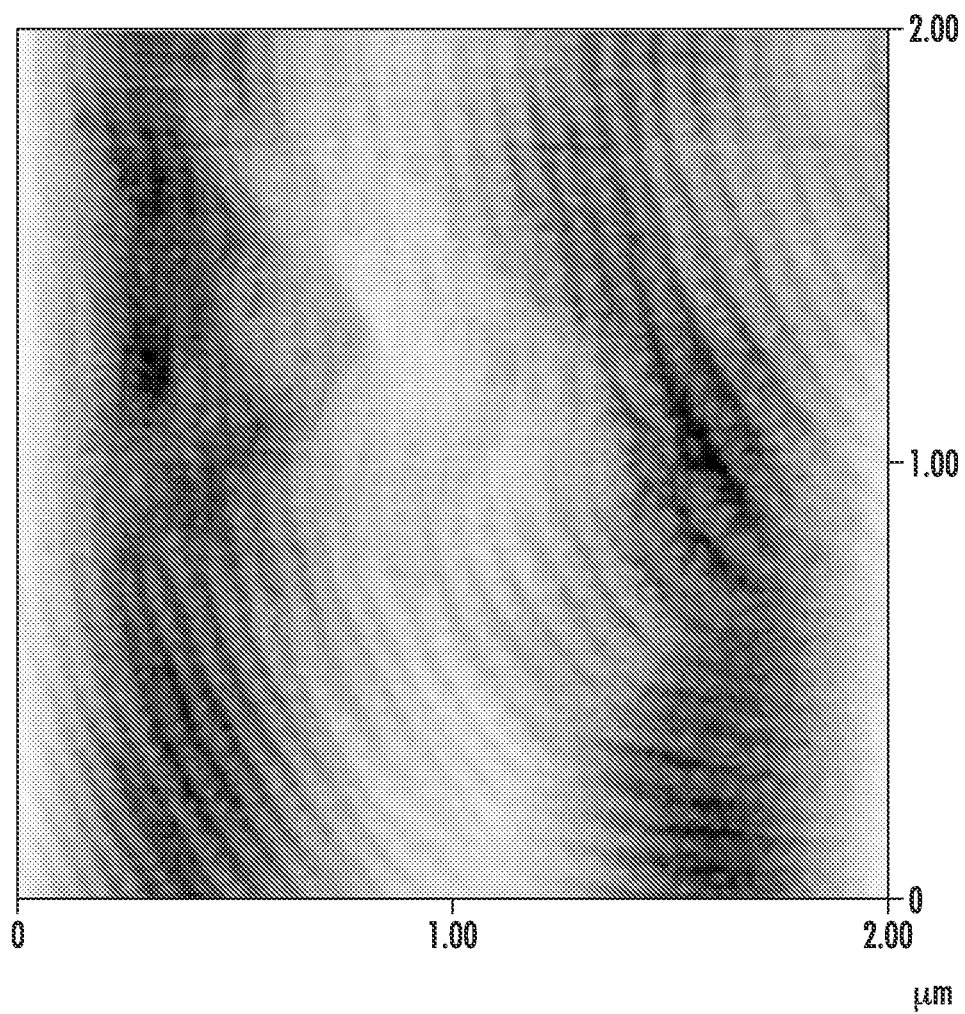
FIG. 3 shows an atomic force microscopic image of the MOHVPE formed AlN layer of Example 1.

The surface morphology was then studied using an atomic force microscope scan. These data for a 2×2 µm$^2$ scan are included in FIG. 3. The scan area was over the laterally grown region. As seen the surface of the wafer is extremely smooth with a [RMS] roughness of only 0.2 nm. The well defined steps clearly imply that the growth mode is dominated by two-dimensional step flow growth. The laterally overgrown material has long parallel atomic steps without step termination indicating a reduced threading dislocation (TD) density. Height difference of 2.8 Å corresponds to approximately 1 ML of (0001) AlN (c/2=2.5 Å). The step termination marked by an arrow, corresponds to either pure screw or mixed screw-edge character. The on axis (002) and the off-axis (102) X-ray spectra for the MOHVPE AlN layer were then measured. The linewidths for these X-ray peaks were respectively 150 and 290 arcsec. It is well established that for the III-N material system the off-axis X-ray peak line-width is a direct reflection of the film quality and can be used for estimating the number of the edge dislocations.[8a] The 290 arcsec off-axis X-ray linewidth for the MOHVPE AlN layer clearly indicates it to be of a very high crystalline quality.

Figure 4:
FIG. 4 shows a dark field transmission electron microscopic images of the MOHVPE formed AlN layer of Example 1. The images are taken to show screw-type and the edge-type threading dislocations: (a) g=0002 (b) g=11$\bar{2}$.
Figure 4:

To confirm this, the layers were analyzed using cross-section transmission electron microscopy (TEM). The TEM thin film was pre-thinned to ~20 µm by mechanical polishing and then thinned to electron transparency by using a dual-beam focused ion beam (FIB) system with a liquid Ga$^+$ source. The diffraction contrast TEM analysis was performed in a FEI CM-200 FEG transmission electron microscope. In FIG. 4, the bright-field TEM micrographs show the cross-section view of a lateral overgrown AlN stripe along a <1$\bar{1}$00> direction. The images are taken under different two-beam conditions to show the edge-type and screw-type threading dislocations (a) g=11$\bar{2}$0; (b) g=0002. Threading dislocations are only observed in the region above mesa and has a density of about $10^9$ cm$^{-2}$. Most of them are pure-edge type. In the lateral growth region, the density of threading dislocations reduces significantly to less than $10^8$ cm$^{-2}$. In this sense, the lateral overgrowth method is very efficient in reduction of threading defects in the laterally overgrown AlN films. In addition, parasitic growth in the trench does not create any problems for the merger of the AlN lateral overgrown stripes.

Figure 5:
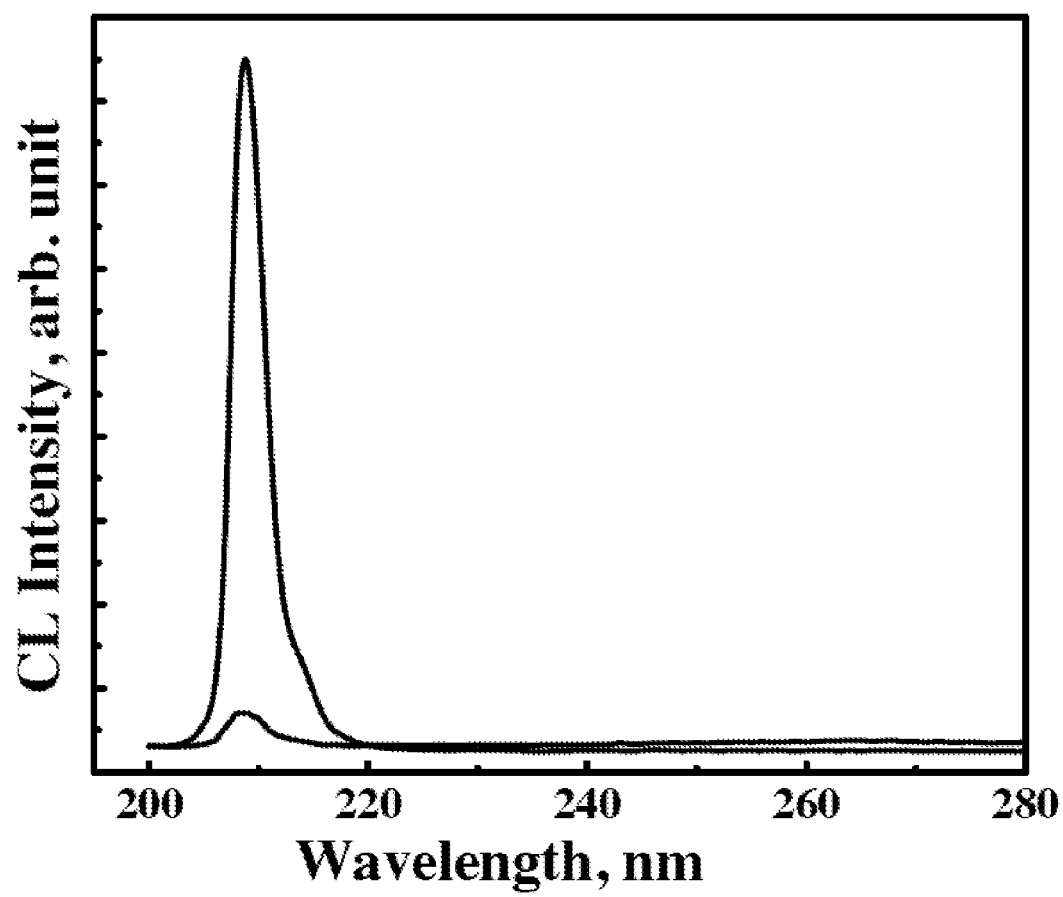
FIG. 5 shows a cathodoluminescence spectrum of the MOHVPE formed AlN layer of FIG. 2 and the CL image of the MOHVPE formed AlN layer taken at 210 nm emission (inset).

The improved material quality for the MOHVPE AlN layers was further confirmed using monochromatic cathodoluminescence imaging. For these measurements the electron beam from an SEM was used as the pump source. The CL spectra were collected using a GATAN Mono CL3 system with enhanced UV sensitivity. Cross section CL image of near band edge emission from a lateral overgrown AlN is shown in FIG. 5. The brighter area corresponds to higher intensity of the 210 nm light emission. Stronger emission from the lateral overgrown region material and a relatively weaker intensity from the mesa region are observed. The CL spectra from the spots located on the laterally overgrown and the vertically grown regions show a strong band-edge emission peak at 210 nm, clearly indicating a high optical quality for the MOHVPE grown AlN layer. Furthermore, the intensity of the emission signal from the laterally overgrown material was about a factor of 20 higher than that from the vertically grown region. It was approximately a factor of 40 higher than the best MOCVD grown AlN films. These data clearly show that the quality of the MOHVPE AlN material to be much superior in the lateral overgrown region. These CL data are in very good agreement with the conclusions derived from the cross-section TEM and the off-axis X-ray data.

It was shown that these MOHVPE AlN/sapphire templates were of an extremely high structural and surface quality and the lateral epitaxy resulted in a reduction of the edge dislocations by approximately a factor of 100 from their starting value of $1 \times 10^{10}$ cm$^{-2}$. Previous simulations have shown that the thin AlGaN to sapphire, and sapphire to air interfaces result in non-negligible thermal impedance for the device with approximate values ranging from 88 to 143° C./W. It has also been shown that even for the flip-chipped devices at least 20% of the heat is removed through the substrate. This increases for the unpackaged case. Therefore the composite AlN (15-20 µm)/sapphire templates result in thermal impedance benefits similar to that achieved for devices using bulk SiC or AlN substrates.

Formation of LED Layers

Figure 6:
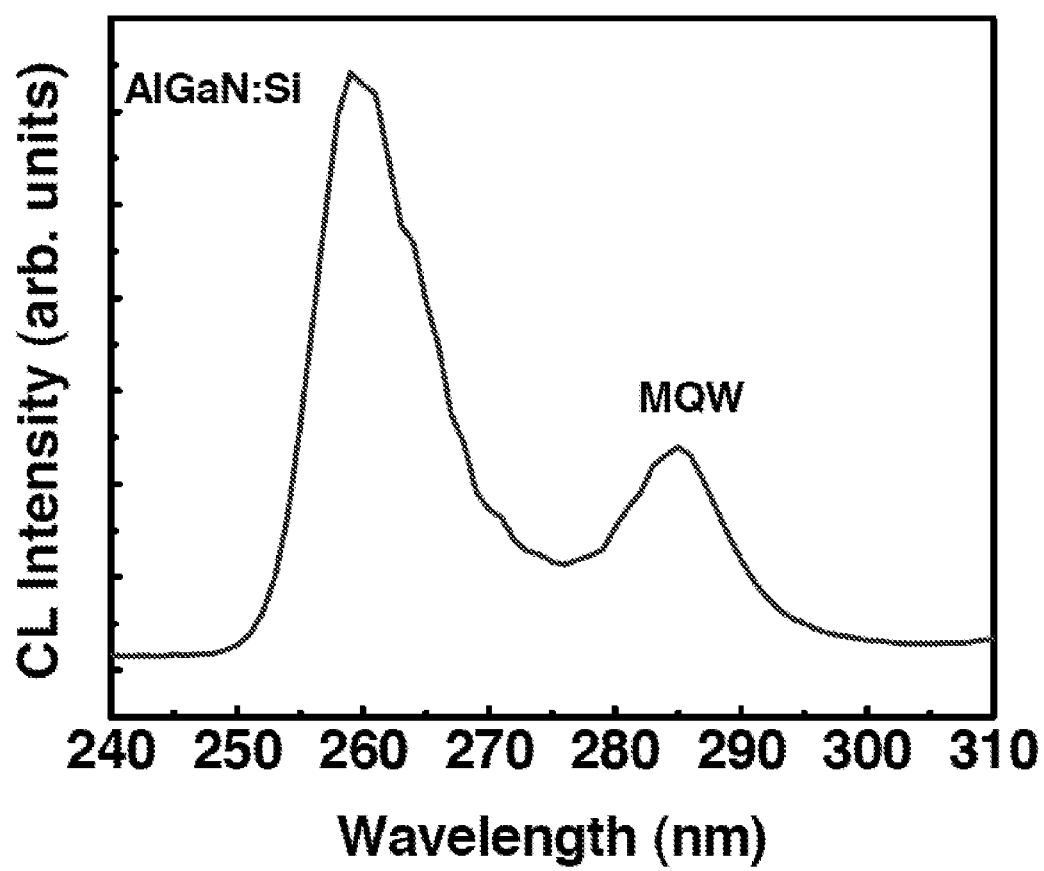
FIG. 6 shows cathodoluminescence spectra of the deep UVLED LED of Example 1 with emission peaks at 260 nm and 285 nm corresponds to AlGaN:Si and MQW layers and the CL image of AlInGaN multiple quantum well taken at 285 nm emission (inset).

The viability of the combinational growth reactor and the MOHVPE growth approach for thick-lateral epitaxy of AlN buffers and deep UV LED devices in a single run was then demonstrated. For this an experiment was carried out where the 17-µm-thick AlN buffer layer growth was followed by depositing an $Al_xGa_{1-x}N$ multiple quantum well (MQW) based p-n junction LED structure. The AlGaN compositions in the active layers were selected for emission at 285 nm. The LED epilayer structure was similar to the one discussed in an earlier report. Surface CL emission spectrum of the LED epilayer and a cross-section CL image taken at 285 nm are included in FIG. 6. As seen the emission signal at 285 nm from the device structure on the MOHVPE template is clearly distinct and of a high intensity. The bright cross-section CL image at 285 nm confirms the high quality of the MQW layer. This clearly establishes the viability of using the MOHVPE technique for depositing high-quality laterally grown thick-buffer and device Using the composite MOHVPE AlN templates described above as substrates, 285 nm deep UV LEDs that exhibit stable output power vs. time under high cw-current density operation are now reported. Electrical and optical characterization results are compared with conventional milliwatt-power UV LEDs, clearly showing the advantages of MOHVPE LEDs such as significantly improved lifetimes due to the reduced dislocation density (particularly for edge dislocations) and much lower thermal impedance resulting from the thick AlN (15-20 μm) heat spreading layer.

Figure 7B:
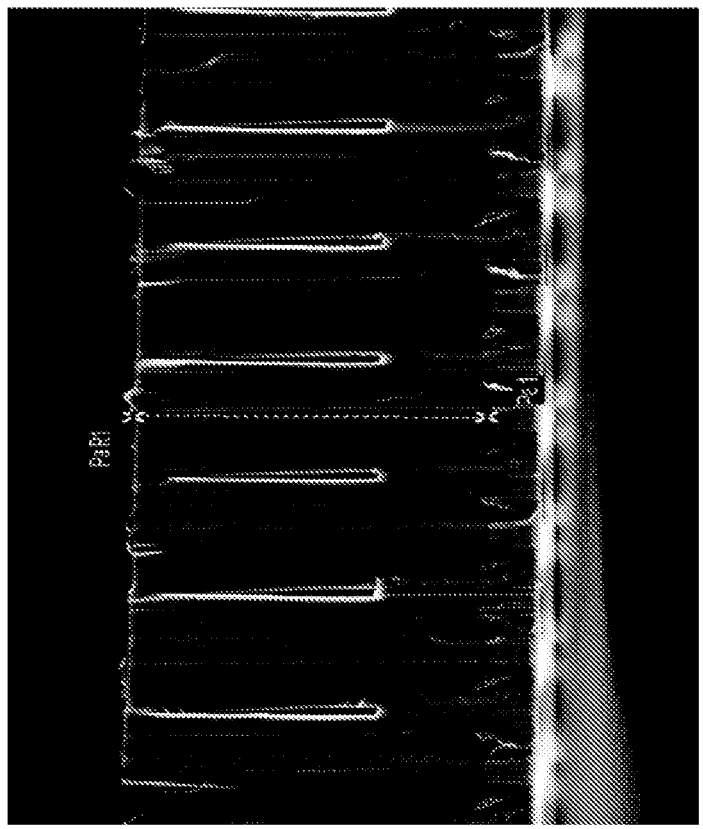
FIG. 7b shows the SEM image of the device epilayer structure of Example 1.
Figure 7A:
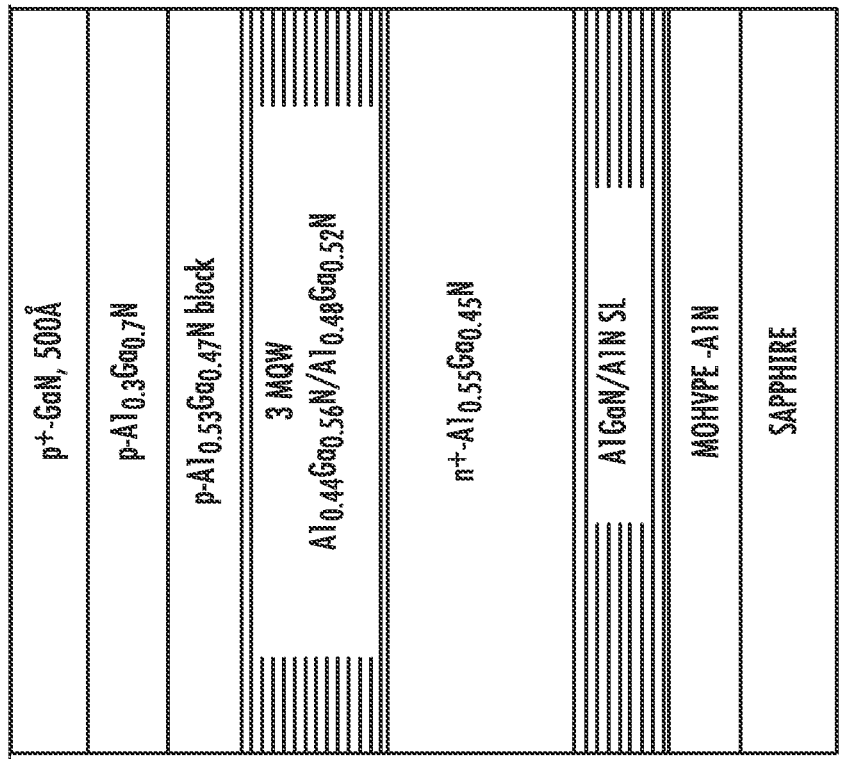
FIG. 7a shows a schematic diagram of the device epilayer structure of Example 1.

The epilayer structure for these devices is shown schematically in FIG. 7(a). As seen it consists of first growing a 20 μm thick AlN layer over sapphire using the previously described MOHVPE process. FIG. 7(b), shows a cross-sectional scanning electron microscope (SEM) image of the coalesced 20 μm thick MOHVPE AlN template. The UV LED was grown using a combination of PALE and conventional MOCVD and included an AlN/AlGaN strain management superlattice and p+-GaN/p-$Al_{0.3}Ga_{0.7}N$ hole injection contact layer, similar to that of our previous reports.[1,] The active region of the device was modified to include three $Al_{0.40}Ga_{0.56}N/Al_{0.48}Ga_{0.52}N$ MQWs. A 200 Å thick p-$Al_{0.53}Ga_{0.47}N$ electron blocking layer was also incorporated directly above the quantum wells. $SiH_4$ and $Cp_2Mg$ were used for the n-type and p-type dopants, respectively. The p-dopant was activated using a 30-minute 800° C. anneal under flowing nitrogen.

The samples were initially cleaned by boiling in organic solvents and subsequently dipping them in a dilute HF:DI solution, to remove any native oxide formation. Mesa type LEDs with several different electrode geometries and active areas were then fabricated using reactive ion etching (RIE) to access the bottom n+-$Al_{0.55}Ga_{0.45}N$ layer of the MOHVPE LED epilayers. These included circular devices with diameters ranging from 20-50 μm and rectangular devices with electrode dimensions from 50 μm to 150 μm for each side. Ti/Al/Ti/Au and Ni/Au were used as metal contacts for the n- and p-contacts, respectively. The n-contact-anneal temperature and time was increased to 950° C. and 1 minute. This resulted in improved contact resistivities compared with previously reported devices. Finally, thick probe pads were deposited on both contacts. From TLM measurements, we determined the n- and p-contact resistivities to be around $1\times10^{-5}$ Ω-$cm^2$ and $3\times10^{-3}$ Ω-cm2 respectively. The sheet resistivity of the silicon doped n+-$Al_{0.55}Ga_{0.45}N$ layer was estimated to be 0.05 ohm-cm.

Figure 8:
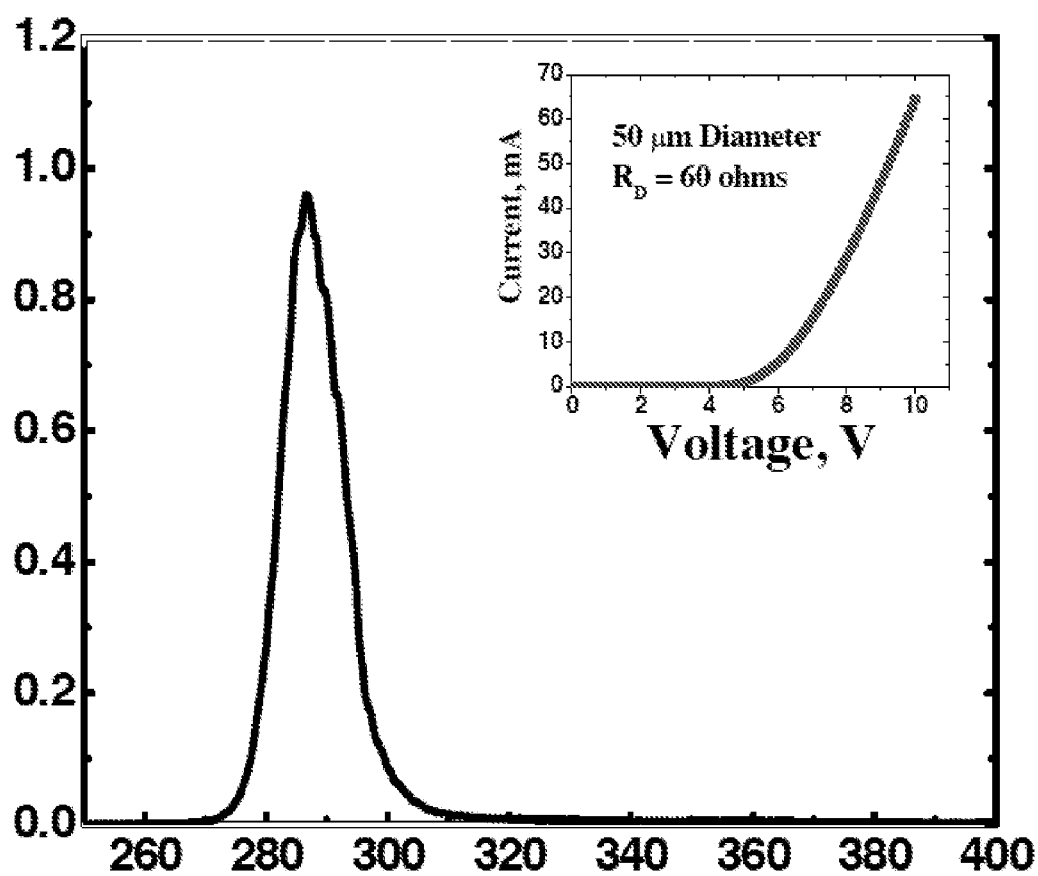
FIG. 8 shows an electroluminescence emission spectrum of circular diodes with 50 µm diameter at 20 mA cw operation of Example 1, and the dc I-V curve of the LED (inset).
Figure 9:
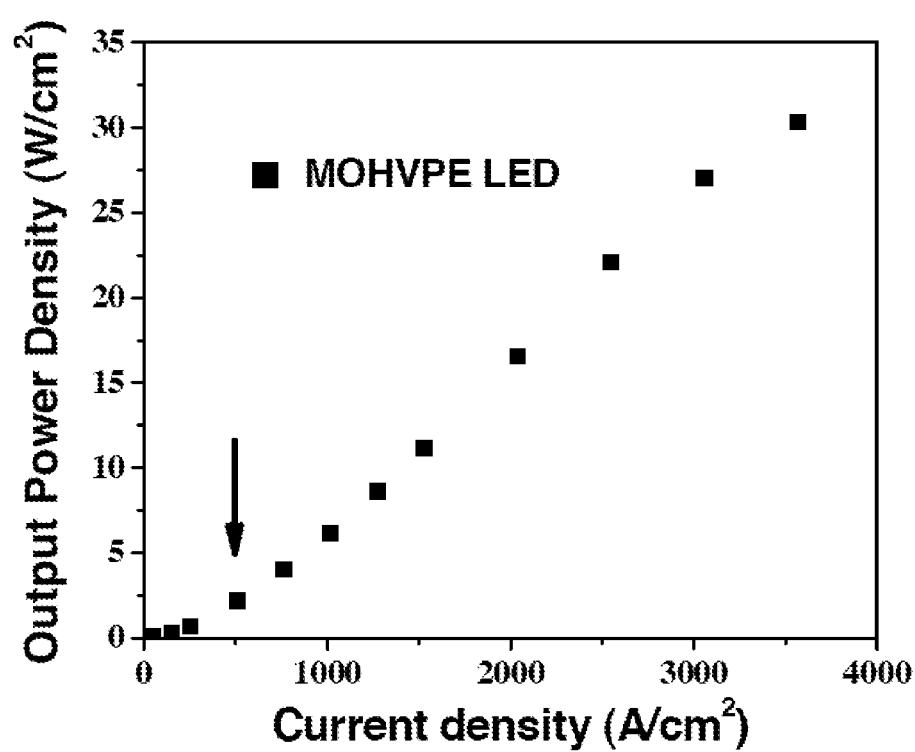
FIG. 9 shows comparative cw output power density plot as discussed in Example 1.
Figure 10:
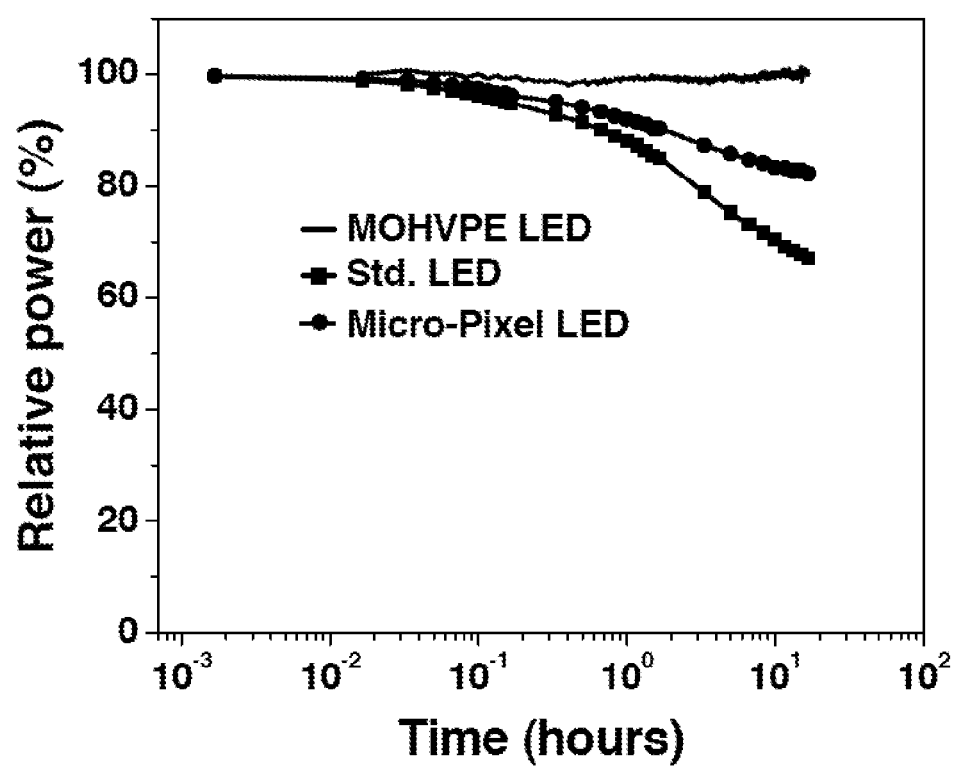
FIG. 10 shows the lifetime reliability test for an MOHVPE formed 280 nm LED as discussed in Example 1.

FIG. 8 shows the emission spectra of a 50 μm diameter LED at 20 mA continuous wave (cw) operation. A strong band-edge emission peak at 285 nm is clearly visible. Also shown in the inset to FIG. 8 are the current voltage (I-V) characteristics. They indicate a turn-on at about 5.5 V with a diode series resistance of 60Ω. Light output vs. power characteristics were measured by placing the LED wafers directly above a UV-enhanced calibrated Si-photodetector. The power density vs. current density, measured for the device of FIG. 3 under dc bias, are plotted in FIG. 9. It is important to note from FIG. 9 that small periphery MOHVPE LEDs, such as a 50 μm diameter device, were able to sustain extremely high current densities, up to 4000 A/$cm^2$, without the power saturating. This indicates improved thermal dissipation for the LEDs grown on the MOHVPE AlN templates compared to the conventional MOCVD grown devices. Both output power and thermal management improves further after flip-chip bonding and final packaging. The arrow on FIG. 9 shows the current density for power saturation for a flip-chipped and fully packaged conventional first generation MOCVD grown UV LED on a sapphire substrate. The conventional LED output power saturated at approximately 0.5 kA/$cm^2$ (delivering an output power density of 3-5 W/$cm^2$) under CW bias. It should be noted that for conventional UV LEDs, the saturated input current density is increased by about 80% when the devices were flip-chipped to a heat sink and placed on a TO header. Therefore, the MOHVPE LEDs are expected to handle current densities well in excess of 4.0 kA/$cm^2$ after packaging. The output powers are also expected to increase by approximately 3 to 5× based on previous flip-chip designs coupled with the addition of collecting light scattered by the air pockets in the MOHVPE templates which is not collected during on-wafer measurements. Then the output powers under cw-pump currents for an MOHVPE LED with a 50 μm×150 μm rectangular electrode geometry were measured. These data are included in the inset to FIG. 9. As seen even the unpackaged MOHVPE LEDs are well capable of producing stable, near milliwatt output powers. As mentioned before we expect these to go up by a factor of 3 to 5 after packaging.

To study the effects of better thermal management (owing to the thick MOHVPE AlN template) and defect reduction on device lifetime, the MOHVPE light emitting diodes were subjected to on wafer-life testing experiments. It is important to note that on-wafer testing (without a flip-chip package) is a stringent test for determining the role of substrate thermal management because all heat must be dissipated either directly into the air or through the substrate. The diodes were stressed at 20 mA cw constant current and compared with conventionally grown LEDs with the results shown in FIG. 9. The MOHVPE LEDs were rectangular shaped 50 μm×150 μm (area $7.5\times10^{-5}$ $cm^2$). The conventional PALE/MOCVD LEDs for comparison were processed in both 100 μm×100 μm (area $1.0\times10^{-4}$ $cm^2$) squares and also using our 10×10 micro-pixel design with each pixel having a diameter of 20 μm (area $3.14\times10^{-4}$ $cm^2$). This translates to an operating current density of ~266 A/$cm^2$, 200 A/$cm^2$, and 64 A/$cm^2$ for the MOHVPE LED, conventional sapphire LEDs, and the micro-pixel geometries, respectively. It is evident that the life-time of the light emitting diodes on grown on thick, lower defect density MOHVPE AlN templates is tremendously improved compared to the conventional LEDs. The MOHVPE LEDs even showed a slower output power decrease with time when compared to the micro-pixel LEDs which were operated at a much lower current density and had a lower series resistance (less current crowding and joule heating). The MOHVPE LEDs showed no appreciable decrease in power up to 60 hours (for on-wafer device characterization) as opposed to previous studies showing the conventional sapphire substrate based UV LEDs with an initial fast decay in output power followed by a slower decay. From past calibrated measurements comparing on wafer and packaged LED lifetimes, the lifetime of the MOHVPE LEDs at 20 mA cw pump current was estimated to be well over 5000 hours.

In summary, for the first time the growth and the fabrication of 285 nm deep UV LEDs over thick MOHVPE AlN-sapphire templates is reported. Milliwatt power highly stable sub-300 nm emission LEDs with lifetimes over 5000 hours are demonstrated. The efficiency of these devices can be further increased through optimization of the active layer design, further improvements in MOHVPE layer quality and a better thermal management and light extraction with flip-chip packaging. The results show an excellent potential for the robust MOHVPE deep UV solid-state light sources for integration in UV systems.

Example 2

Figure 11A:
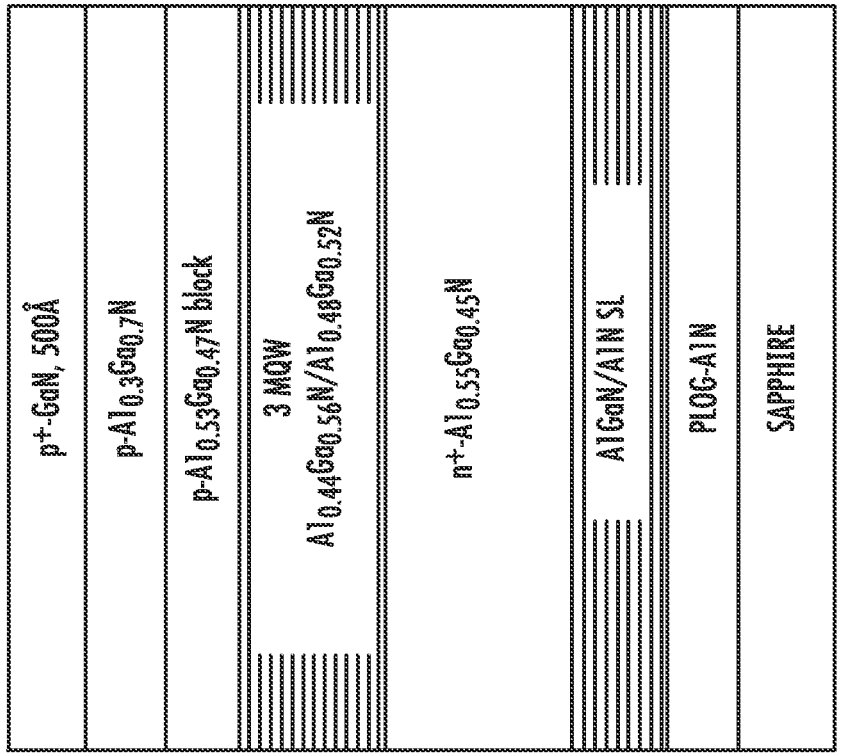
FIG. 11 (a) shows a schematic diagram of the device epilayer structure of Example 2.
Figure 11B:
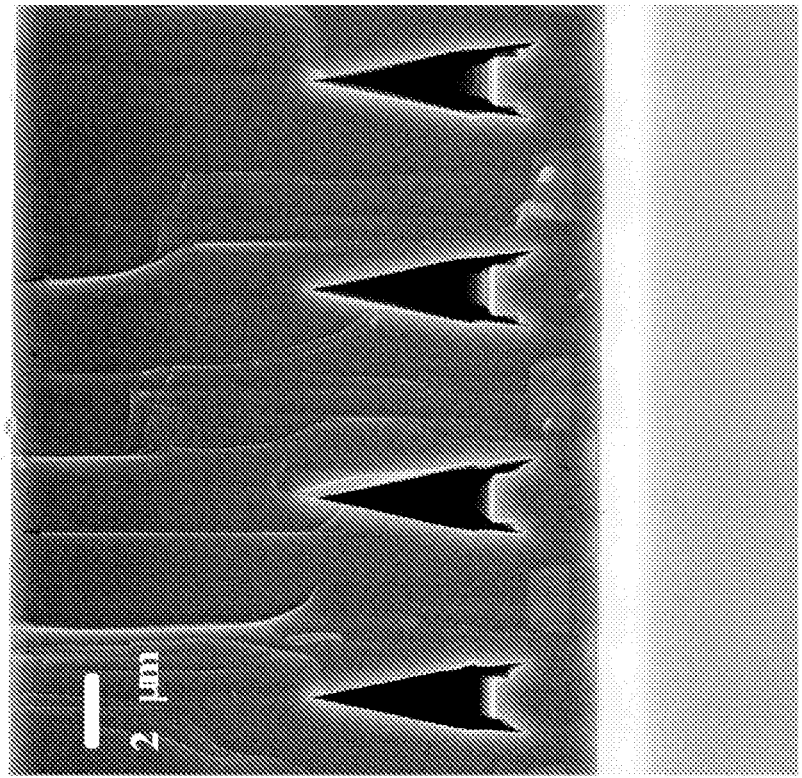

The epilayer structure for the PLOG devices of this study is shown in FIG. 11(a). The experiments comprised growing a 20 μm thick AlN layer over sapphire using the PLOG process, followed by the deposition of the epilayers of FIG. 11(a) using a combination of Pulsed and conventional low-pressure metal organic chemical vapor deposition (MOCVD) processes. The entire fabrication procedure is carried out in a low-pressure MOCVD chamber at a growth pressure of 76 Torr and at temperatures in the range 850-1200° C. FIG. 11(b)

shows a cross-sectional scanning electron microscope (SEM) image of the coalesced 20-μm-thick PLOG AlN template. The active region of the device comprised of three $Al_{0.44}Ga_{0.56}N/Al_{0.48}Ga_{0.52}N$ MQWs. A 200 Å thick p-$Al_{0.53}Ga_{0.47}N$ electron blocking layer was also incorporated directly above the quantum wells. $SiH_4$ and $Cp_2Mg$ were used as the n-type and p-type dopants, respectively. The p-dopant was activated using a 30-minute 800° anneal under flowing nitrogen.

Mesa type LEDs with an area of 140 μm² were then fabricated using reactive ion etching (RIE) to access the bottom n+-$Al_{0.55}Ga_{0.45}N$ layer. Note this device geometry implies that only 66% of the active area contains low-defect density laterally grown wing regions. Ti/Al/Ti/Au and Ni/Au were used as metal contacts for the n- and p-contacts, respectively. Finally, thick probe pads were deposited on both the contacts. From transmission line model (TLM) measurements, it was determined that the n- and p-contact resistivities to be approximately $1\times10^{-5}$ and $3\times10^{-3}$ Ω-cm² respectively. The sheet resistivity of the silicon doped n⁺-$Al_{0.55}Ga_{0.45}N$ layer was estimated to be 0.05 ohm-cm. The LEDs were then flip-chip mounted on metal coated carriers which were wire-bonded to a metallic header for subsequent testing.

Figure 12:
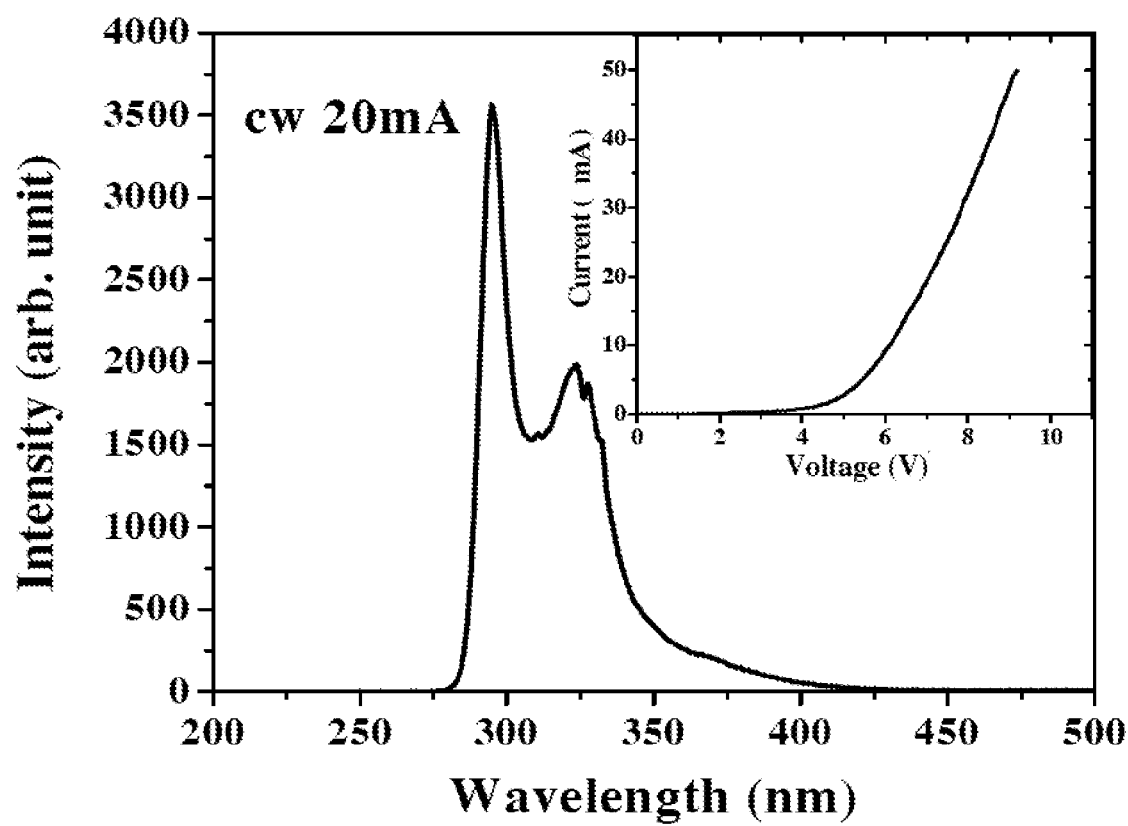
FIG. 12 shows the electroluminescence emission spectrum of 140 µm² diodes at 20 mA of Example 2 and the dc I-V curve of the LED (inset).

Next, the optical and electrical characteristics of the PLOG UVC LEDs for a comparison with our standard milliwatt-power devices over sapphire substrates were measured. FIG. 12 shows the emission spectrum of the PLOG LED of FIG. 11. A strong quantum-well emission peak at 290 nm is clearly visible. An additional emission shoulder peak at 310 nm is also observed. This is from over the barrier injection or defects at the laterally grown AlN coalescence region. It can thus be avoided by a better design of the active region and carefully controlling the growth conditions at the coalescence. Also shown in the inset of FIG. 12 are the device current-voltage (I-V) characteristics. They indicate a turn-on at about 5.5 V with a diode series resistance of approximately 60 Ω.

Figure 13:
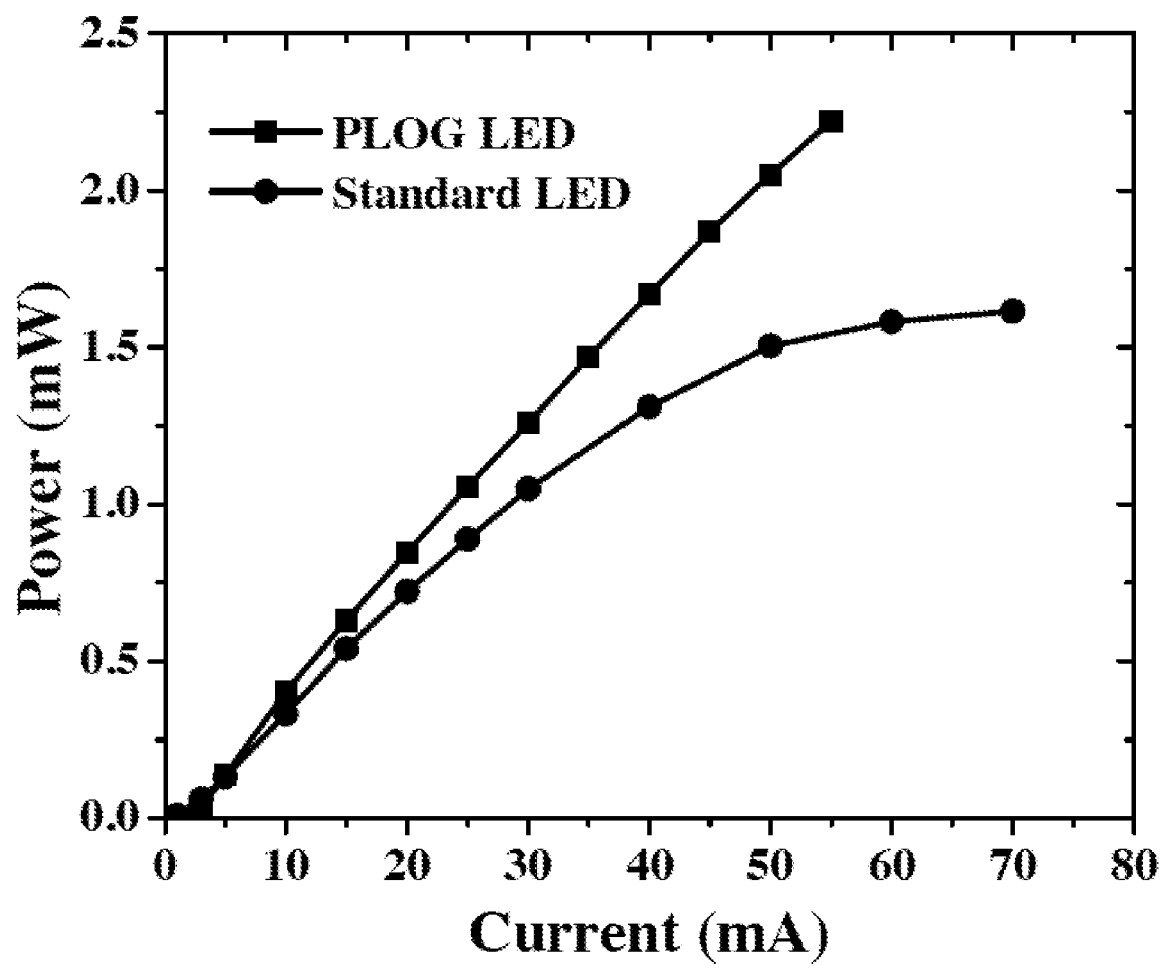
FIG. 13 shows a comparative cw output power plot for Example 2.

Light output versus input electrical power characteristics were then measured by placing the packaged LED in an integrating sphere. Only the power emitted at 290 nm was measured which is plotted in FIG. 13 versus the dc pump current. Also included in FIG. 13 are the data for a standard 290 nm emission LED on sapphire substrate with identical electrode geometry. It is clear from FIG. 13 that the output powers of PLOG AlN based LED devices do not saturate for DC pump currents as high as 55 mA (current density (280 A/cm²) whereas the standard LED output powers start to saturate around 45 mA (230 A/cm²). This is primarily due to the lower thermal impedance caused by the 20 μm thick AlN layer resulting from the PLOG procedure. Furthermore a stable DC power of more than 2 mW was measured for the PLOG LED at a pump current of 50 mA. The improved power and efficiency of the PLOG LED are attributed to the significantly lower defect densities in the portions of the active region which are on the laterally overgrown AlN layers. By increasing the fraction of the laterally overgrown regions the emission efficiencies can further be increased.

Figure 14:
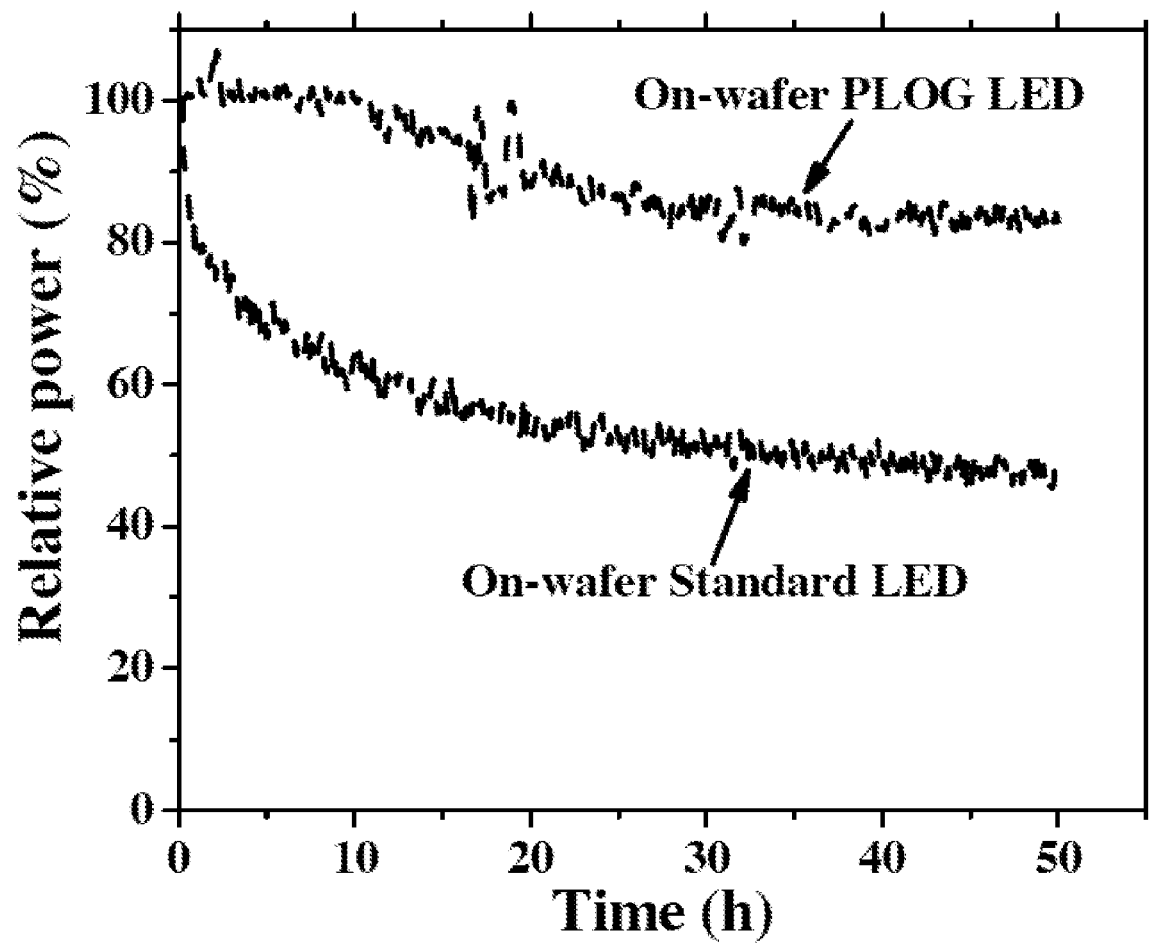
FIG. 14 shows a lifetime reliability test for the un-packaged PLOG formed and conventional light emitting diodes for 290 nm LEDs for Example 2.

To study the effects of better thermal management (due to the 20 μm thick PLOG AlN layer) and the defect reduction on the device lifetime, un-packaged PLOG and conventional light emitting diodes on sapphire were subjected to on-wafer lifetime-testing. The diodes were stressed at 50 mA constant-current and the test results are shown in FIG. 14. It is important to note that on-wafer testing (without a flip-chip package) is a more stringent test for the device's lifetime. The temperature rise for such devices is higher which accelerates the degradation. As seen from FIG. 14, the PLOG LEDs show significantly smaller change in the output power as compared with that of standard LEDs. The power drops to about 84% of the initial value for an initial test time of 30 hours and then saturates indicating highly stable operation. For the same test conditions, the output powers of a standard sapphire substrate LED degrades to a 55% power-point in only 30 hours. From this on-wafer test data and past cross-calibration studies, the lifetime of a fully packaged PLOG LED is approximately 5000 h.[17] A fully packaged PLOG device under test at 30 mA dc pump current has not shown any degradation during the first 200 h of testing.

In summary, the growth and the fabrication of 290 nm UVC LEDs over laterally overgrown thick AlN layers over sapphire substrates is reported for the first time. Under a dc pump current of 50 mA, stable output powers as high as 2 mW were measured for 140 μm² devices. These devices show minimal degradation under an initial on-wafer life-test for times as long as 50 h. Fully packaged device lifetimes are expected to exceed 5000 h. The efficiency of the PLOG devices can be further increased through optimization of the active layer design, improvements in the quality of the PLOG AlN layer and a better light extraction scheme. The results show an excellent potential for the robust PLOG deep UV solid-state light sources for integration in DUV systems.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of making a semiconductor chip for use in a light emitting device, the method comprising
    forming a buffer layer to a thickness of from about 10 μm to about 30 mm over a surface of a basal substrate defining a plurality of grooves, wherein the buffer layer comprises $Al_xGa_{1-x}N$, where $0<x\leq1$, and defines apertures extending from the grooves of the surface of the basal substrate into the thickness of the buffer layer, and wherein a growth mode transition is performed during the formation of the buffer layer from a non-pulse growth mode to a pulse growth mode;
    forming a n-junction LED layer over the buffer layer, wherein the n-junction LED layer comprises $Al_xGa_{1-x}N$, where $0<x\leq1$;
    forming a multiple quantum well LED layer over the n-junction LED layer, wherein the multiple quantum well LED layer comprises $Al_xGa_{1-x}N$, where $0<x\leq1$; and
    forming a p-junction LED layer over the multiple quantum well LED layer, wherein the p-junction LED layer comprises $Al_xGa_{1-x}N$, where $0<x\leq1$.

2. The method as in claim 1, wherein the semiconductor chip is substantially free from indium.

3. The method as in claim 1, wherein the basal substrate comprises a base layer comprising sapphire, aluminum nitride, aluminum gallium nitride, or aluminum indium gallium nitride substrate.

4. The method as in claim 3 further comprising
    etching a plurality of grooves into a surface of the base layer.

5. The method as in claim 3 further comprising
  growing an epilayer over the base layer to form the basal substrate, wherein the epilayer comprises $Al_xGa_{1-x}N$, where $0<x\leq1$ and is from about 0.05 μm to about 4 μm thick; and
  etching a plurality of grooves into the epilayer.

6. The method as in claim 1, wherein the thickness of the buffer layer is from about 10 μm to about 40 μm.

7. The method as in claim 1, wherein the thickness of the buffer layer is from about 20 μm to about 25 μm.

8. The method as in claim 1, wherein the apertures are substantially triangular in shape.

9. The method as in claim 1 further comprising
  separating the basal substrate from the buffer layer such that the basal substrate is omitted from the formed semiconductor chip.

10. The method as in claim 1 further comprising
  applying a pair of electrodes to the semiconductor ship over the p-junction LED layer to form a light emitting device.

11. The method as in claim 10, wherein the multiple quantum well emits light having a wavelength from about 190 nm to about 369 nm.

12. The method as in claim 10, wherein the light emitting device has a lifetime of about 1 hour to about $10^6$ hours.

* * * * *